US007001930B2

(12) United States Patent
Arnold et al.

(10) Patent No.: US 7,001,930 B2
(45) Date of Patent: Feb. 21, 2006

(54) ACRYLIC RESIN FORMULATIONS CURABLE TO CLEAR, HEAT-RESISTANT BODIES

(75) Inventors: John R. Arnold, Burlington, CT (US); Maria Fe Aton Audia, Torrington, CT (US)

(73) Assignee: Dymax Corporation, Torrington, CT (US)

( * ) Notice: Subject to any disclaimer, the term of this patent is extended or adjusted under 35 U.S.C. 154(b) by 131 days.

(21) Appl. No.: 10/341,670

(22) Filed: Jan. 14, 2003

(65) Prior Publication Data

US 2004/0138326 A1 Jul. 15, 2004

(51) Int. Cl.
*C08F 2/46* (2006.01)

(52) U.S. Cl. ............................ 522/90; 522/92; 522/93; 522/95; 522/96; 522/174; 525/123; 525/127; 525/440; 525/453; 525/454; 525/455; 525/528; 525/531; 528/73; 427/487; 362/231

(58) Field of Classification Search .................. 522/92, 522/90, 93, 95, 96, 174; 525/123, 127, 440, 525/453, 454, 485, 528, 529, 531; 528/531, 528/73

See application file for complete search history.

(56) References Cited

U.S. PATENT DOCUMENTS

| | | | | | |
|---|---|---|---|---|---|
| 3,528,844 | A | * | 9/1970 | Burlant et al. | 428/334 |
| 4,126,527 | A | * | 11/1978 | Kaufman | 522/168 |
| 4,401,793 | A | * | 8/1983 | Chiao et al. | 525/285 |
| 4,656,237 | A | * | 4/1987 | Weber, Jr. | 526/320 |
| 5,496,904 | A | * | 3/1996 | Moriya et al. | 526/318.4 |
| 5,605,959 | A | * | 2/1997 | Moriya et al. | 524/853 |

FOREIGN PATENT DOCUMENTS

| | | | |
|---|---|---|---|
| JP | 03-153768 | * | 7/1991 |

OTHER PUBLICATIONS

Elvacite Technical Data Sheet entitled "Elvacite® Acrylic Resins Compatibility Guide For Radiation Curable Monomers".

Elvacite Technical Data Sheet entitled "Elvacite® Resins as Additives for Radiation Curable Inks and Coatings Formulations".

Technical Data Sheet entitled "PB-204".

* cited by examiner

*Primary Examiner*—Bernard Lipman
(74) *Attorney, Agent, or Firm*—Ira S. Dorman

(57) ABSTRACT

A non-aqueous, solvent-free formulation for producing clear, transparent, heat-resistant elements, suitable for use as lenses in optoelectronic devices, consists essentially of an acidic, nonpolymerizing acrylic resin; THFA, DMA, HEMA, HBA, or an equivalent polymerizable diluent in which the acrylic resin is dissolved; and a free-radical photoinitiator.

30 Claims, No Drawings

ACRYLIC RESIN FORMULATIONS CURABLE TO CLEAR, HEAT-RESISTANT BODIES

BACKGROUND OF THE INVENTION

Electronic devices called "chip-on-board light-emitting diodes" (COB-LEDs) comprise an LED or LED array mounted on a printed circuit board and protected by an overlying transparent lens or other element, usually molded from a synthetic resinous material, which may serve to direct and focus the light. It is of utmost importance that the protective element (hereinafter referred to, for convenience, as the lens) of a COB-LED device remain optically transparent for an extended period of time; indeed, it is the durability of the lens that often determines the useful life of the device. The cured resin must therefore resist degradation from exposure to radiation emitted from the LED itself and other causes, such as outdoor environmental effects.

Unlike LED arrays used in calculator displays and the like, many potential applications for COB-LED devices require extraordinary brightness and entail the use of relatively high electrical currents. The corresponding levels of heat generated often make temperature management a primary design and engineering consideration, and give rise to a need for a lens-forming resin that is capable of resisting high-temperature thermal degradation and distortion.

Attempts to use one-part, radiation-cured urethane, epoxy, and rubber acrylates, and formulas based on cationic epoxies and vinyl ethers, in the manufacture of COB-LED products have, as far as is known, been unsuccessful due to unacceptable degradation of the cured resins at elevated temperatures, over time. For example, in a test procedure involving exposure for four days to a temperature of 140° C., most standard urethane acrylates are found to turn dark brown; cationic epoxies turn dark yellow, and even the better performing urethane, epoxy, and rubber acrylates take on a pronounced yellow coloration under the conditions described; and in any event light transmission is usually reduced significantly.

SUMMARY OF THE INVENTION

Accordingly, it is a broad object of the present invention to provide a novel, non-aqueous and solvent-free formulation that cures to a transparent solid body of high optical clarity, which body exhibits outstanding resistance to thermal degradation and distortion, as well as to degradation from radiation and moisture exposure.

A more specific object of the invention is to provide such a formulation that is especially adapted for the fabrication of bodies suitable for use as transparent protective elements and lenses for COB-LEDs and similar optoelectronic devices, particularly devices that operate at relatively high temperatures.

Further specific objects are to provide such formulations in a range of viscosities, adapted for fabrication by a variety of techniques, including direct application to a substrate in the form of a mechanically unconstrained dome, followed by irradiation to effect curing of the formulation; and to provide such formulations which cure rapidly upon exposure to suitable actinic radiation.

Additional objects of the invention are to provide novel methods for the production of heat- and radiation-resistant transparent solid bodies, and optoelectronic devices comprised of such bodies, and to provide solid bodies and optoelectronic devices produced by such methods.

It has now been found that certain of the foregoing and related objects of the invention are attained by the provision of a formulation broadly comprised of about 10 to 40 (and preferably at least 20) weight percent of a nonpolymerizing acidic acrylic resin, about 90 to 45 weight percent of a selected reactive diluent in which the resin is soluble, and an amount of a free-radical photoinitiator effective to initiate polymerization of the reactive diluent, the formulation being at least substantially free of water and solvents.

The acidic character of the acrylic resin is attributable to its inherent carboxylic acid functionality (rather than to a residual, unreacted ingredient), and the resin will normally have an acid value of at least 20 milligrams of potassium hydroxide per gram of acid (mg KOH/g); preferably, the acid value will be 25 mg KOH/g or higher. Albeit acrylate resin having a molecular weight as high as 200,000 may be useful in the present formulations, particularly when intended for use as encapsulants, coatings, adhesives, and the like, the molecular weight of the acrylic resin employed in a lens-forming formulation will usually not exceed 80,000; indeed, for such applications the molecular weight of the resin will preferably be in the range 8,000–12,000 and most desirably it will be about 9,000 to 10,000.

Due to its overall solubility (and the resultant capacity for use in relatively high concentrations), its clarity, and its resistance to thermal degradation, the presently preferred acrylate resin is a high Tg solid acrylic bead resin having an acid value of 22 to 30 mg KOH/g and a molecular weight of 9,000, commercially available from Dianal America, Inc., of Pasadena, Tex., under the trade destination "PB-204" (according to information provided in a Dianal technical data sheet, U.S. Pat. Nos. 5,496,904 and 5,605,959 may be deemed to disclose the PB-204 resin). A higher molecular weight resin, designated "PB-504" and believed to be produced from the same molecule, can be employed to similar benefit but, because of its lower solubility in the reactive monomers, PB-504 provides somewhat less optical clarity than PB-204 at equivalent concentrations. In any event, the outstanding performance exhibited by the PB-204 and PB-504 products in the instant formulations is attributed to the presence of unreacted hydroxyl groups on the backbone of the acrylate monomer from which the resins are produced.

Although other monomers may be found suitable for use as the polymerizable reactive diluent in formulations embodying the invention, best results (in order of decreasing preference) are achieved using tetrahydrofuryl acrylate (THFA), N,N dimethyl acrylamide (DMA), 2-hydroxyethyl methacrylate (HEMA), and hydroxybutyl acrylate (HBA). Hydroxypropyl acrylate (HPA), methacrylates corresponding to the foregoing acrylate compounds, alkoxylated counterparts to the foregoing, other acrylates and acrylamides containing reactive hydroxy groups, and carbon and nitrogen-substituted analogs of the indicated acrylamides should also produce good results. Needless to say, mixtures of two or more of the designated compounds can constitute the polymerizable diluent of the formulation, as may be preferred.

It has been found that very few polymerizable monomers are effective to solublize acrylic resins sufficiently to produce clear liquids, and that even fewer such monomers, containing the dissolved acrylic resin, will cure to the optically clear, relatively thick bodies that are provided by the instant invention; indeed, as discussed below, a number of the most commonly employed reactive diluents are found to be unsatisfactory for present purposes. Moreover, solvent strength is not the sole criterion. For example, while the use of DMA leads to formulations containing the highest concentrations of acrylic resin, THFA exhibits better thermal resistance when heated. And although HEMA and HBA are considerably less effective than DMA and THFA for solublizing the acrylic resins, they are nevertheless among the most satisfactory reactive diluents suitable for use in the practice of the invention.

While all free-radical photoinitiators that do not inherently impart color, or cause or promote degradation of the cured body after exposure to high temperature and radiation, are regarded to be suitable for use in the present formulations, preferred UV photoinitiators include 1-hydroxycyclohexyl phenyl ketone, 2-hydroxy-methyl-1-phenyl propanone, benzophenone, and methybenzolformate. Conventional visible light-responsive photoinitiators may also be effective, and may be necessary when a UV-blocking dye or pigment has been included in the formulation.

Optional ingredients in the formulation include acidic adhesion promoters (preferably crotonic acid, acrylic acid and methacrylic acid), normally used in a concentration of about 1.0 to 5.0 weight percent, cross-linking agents to adjust hardness (e.g., trimethanolopropane triacrylate [TMPTA] and 1,6 hexanediol diacrylate [HDDA]), normally used in concentrations of about 1.0 to 30 weight percent (but preferably in amounts less than five percent, depending upon the particular agent employed, for maximum clarity), thickeners (preferably thioxotropic thickeners, most desirably of non-silica composition), normally used in a concentration of about 0.5 to 4.0 weight percent, and heat and product stabilizers, normally used, alone or together, in a total concentration of about 0.1 to 4.0 weight percent.

More specifically, polymerizable organic acids that are suitable for use as adhesion promoters in the instant formulation include, in addition to crotonic acid, acrylic acid and methacrylic acid, itaconic acid, and maleic acid, which are listed here in general order of preference based primarily upon resistance to discoloration (yellowing) as tested at 140° C. in the present formulations. It might be noted that the outstanding performance of crotonic acid, as a particularly preferred adhesion promotor, is unexpected due to its relatively low reactivity as compared to the reaction rates of acrylate and methacrylate monomers.

Any cross-linking agent employed should itself be very clear and should of course be so selected as to not adversely affect clarity of the cured body or degradation therein over time or due to heat (or other) exposure. It should be noted that dome elements (e.g., for COB-LED devices), with adequate hardness and good thermal resistance, can be made from the present formulations utilizing THFA as the reactive monomer and containing no cross-linking agent; the flexibility imparted by THFA affords good protection for the diode component, and increases the robustness of the device. A crosslinker can of course be incorporated to tailor the hardness of the cured body, and typically THFA-based formulations can cure to hardness values ranging from A-50 to D-90 depending upon the nature and amount of crosslinker added. Whereas HEMA- and DMA-based elements normally exhibit hardnesses of D-75 or higher, their relative brittleness and rigidity makes them less desirable, as compared to THFA-based formulations, at least for use in certain applications. The incorporation of a cross-linking agent into formulations in which, for example, DMA is employed as the reactive diluent additionally appears to be important from the standpoint of affording good resistance to water absorption.

Any thickeners added will generally be selected for effectiveness at low concentrations, so as to minimize optical distortion; thixotropic organic products are preferred. While it has been found that fumed silica thickeners cause significant clouding in the cured formulation, chemically treated fumed silicas, and especially those into which long-chain organic substituents have been introduced, appear to cause less haze and therefore to be more suitable for use herein.

Lenses and other transparent elements, employed for example in COB-LED devices, are typically ⅛-inch thick, or thicker. Haze, whiteness and flaws that may be invisible in typical thin coatings can therefore affect the quality of such components very significantly. Even at resin concentrations as low as about five weight percent, for example, acrylate monomers such as TMPTA, TRPGDA (tripropylene glycol diacrylate), HDDA, ODA (octyl/decyl acrylate mixture), EOEOEA (ethoxylated ethyl acrylate), PEA (2-phenoxyethyl acrylate), PETA (pentaerythritol triacrylate), etc., which are commonly used in acrylate coating compositions, have all been found to produce domes that are white (rather than clear). While those monomers may be present in low concentrations, therefore, such as for crosslinking purposes, they are not suitable for use as the primary reactive diluent in the instant formulations.

Moreover, it is found that IBOA (isobornyl acrylate), a typical nonpolar monomer, cannot adequately solubilize acrylic resins employed herein, such mixtures being characterized as thick and almost pasty, and tending to form precipitates rapidly. And while certain acrylate monomers that are widely utilized for other purposes are capable of solubilizing the acrylate resins employed at low concentrations, their low solvent strength makes them of little use in the present formulations.

Other objects of the invention are attained by the provision of a method for the production of a clear, transparent, heat-resistant solid body, in accordance with which a deposit of a quantity of the formulation herein described is formed, described and is exposed to actinic radiation for effecting polymerization of the reactive diluent. Additional objects are attained by the provision of a method for the production of an optoelectronic device, comprising the steps: providing at least one light-emitting element on a substrate; applying a deposit of a quantity of the radiation-curable formulation to the substrate in overlying relationship to the light-emitting element; and exposing the deposit to actinic radiation for effecting curing of the deposit, to thereby produce a solid body.

Normally, the light-emitting element will be a light emitting diode, and the substrate will desirably comprise a printed circuit board (PCB). The formulation may be cast into a mold, to form a shaped deposit which may then be transferred to the substrate, or it may be dispensed directly thereupon, with curing being initiated either before or after the transfer. The deposit will preferably be dome shaped, to provide an enlarging or focusing lens, in which case the formulation will usually contain an amount of a suitable thickener sufficient to impart a viscosity of about 1,000 to 10,000 cP so as to cause the deposit to maintain its shape until curing has occurred.

Further objects of the invention are attained by the provision of a clear, transparent, heat-resistant solid body, and by the provision of an optoelectronic device, produced respectively by the methods herein described.

DETAILED DESCRIPTION OF THE PREFERRED EMBODIMENT OF THE INVENTION

Exemplary of the efficacy of the present invention are the following specific examples, wherein the amounts of all ingredients identified are expressed as percentages by weight unless indicated otherwise:

TABLE ONE

| INGREDIENT | EXAMPLE: 1-A | 1-B | 1-C |
|---|---|---|---|
| tetrahydrofuryl acrylate | 51.3 | 50.1 | 43.6 |
| acidic acrylic resin (PB-204) | 20.7 | 20.2 | 17.6 |
| triacrylate crosslinker | 4.4 | 4.6 | 4.0 |
| diacrylate crosslinker | 17.5 | 17.1 | 14.9 |
| photoinitiator (IRGACURE 184) | 1.7 | 1.6 | 1.4 |
| stabilizers | 2.0 | 2.0 | 1.8 |
| crotonic acid | 1.7 | 1.6 | 1.4 |
| silane (adhesion promotor) | 0.8 | 0.8 | 0.7 |
| thixotropic organic thickener | | 2.0 | 1.7 |
| fluorescing dye | | | 12.9 |
| TOTAL: | 100.00 | 100.00 | 100.00 |

The formulations defined in Table One as Examples 1-A and 1-B were clear and colorless as prepared; the formulation of Example 1-C was also clear, but was colored by the fluorescing dye. Upon exposure to ultraviolet radiation (10–20 mW/cm$^2$ for 10 to 15 seconds), the formulations cured to clear, tack-free solid bodies which were (again with the exception of 1-C) colorless; none showed evidence of significant degradation during heat aging at 140° C. for more than 3 days.

It will be noted that the formulation of Example 1-A contains no thickener; it is particularly well-suited for casting of LED modules from molds. To do so, a hemispherical, UV-transparent mold is filled with the formulation, and a PCB, having an LED circuit disposed on one face, is placed upon the mold with the LED circuit submerged in the formulation. Curing would then be effected by subjecting the formulation to UV radiation, producing a COB-LED upon separation from the mold. Albeit relatively slow and expensive, this method of fabrication is desirable from the standpoint of optical quality, uniformity and reproducibility of lens shape and contour.

The formulation of Example 1-B contains a thixotropic organic thickener, enabling it to maintain its shape and thereby making it particularly well-suited for the production of COB-LED devices by dispensing the formulation directly upon the surface of a PCB, so as to encapsulate an LED thereon. The deposit assumes and maintains a dome-like contour and shape, and effectively forms a lens over the LED when cured. Needless to say, this technique has the advantage of speed, economy, and facile automation.

The formulation of Example 1-C contains a dye that changes color of the LED from emitting UV light at the chip to emitting white light from the dome. As will be appreciated, however, any dye incorporated will change the color of the LED emission.

Variants of the formulations used in Examples 1-A through 1-C have been made, with comparable results. For example, the amount of the acrylic resin may be varied from about 10 to 40 weight percent (although 15 to 30 percent is preferred), the amount of the reactive diluent (when used) may be varied from 50 to 70 percent, the amount of adhesion promoter may be varied from 1 to 5 percent, the amount of cross-linking agent (when used) may be varied from about 2 to 30 percent, the amount of photoinitiator may be varied from 0.1 to 3 percent, the amount of heat and product stabilizers (when used) may be varied from about 0.1 to 4 percent, and the amount of thickener (when used) may be varied from about 0.5 to 2.0 percent.

TABLE TWO

| INGREDIENT | EXAMPLE: 2-A | 2-B | 2-C | 2-D | 2-E | 2-F | 2-G |
|---|---|---|---|---|---|---|---|
| THFA | 70.0 | 63.0 | 56.6 | 56.6 | 51.5 | 51.3 | 51.5 |
| HEMA | — | — | 10.1 | — | — | 9.2 | — |
| PB-204 | 23.5 | 25.0 | 22.4 | 22.4 | 20.4 | 20.4 | 20.4 |
| triacrylate crosslinker | | 5.5 | 5.0 | 5.0 | 4.5 | 4.5 | 4.5 |
| diacrylate crosslinker | — | — | — | 10.1 | 18.2 | 9.3 | 18.2 |
| IRGACURE 184 | 2.0 | 2.0 | 1.8 | 1.8 | 1.6 | 1.6 | 1.6 |
| stabilizers | 2.5 | 2.6 | 2.3 | 2.3 | 2.1 | 2.1 | 2.1 |
| crotonic acid | 2.0 | 2.0 | 1.8 | 1.8 | 1.6 | 1.6 | 1.6 |
| TOTAL: | 100.0 | 100.0 | 100.0 | 100.0 | 100.0 | 100.0 | 100.0 |
| AVERAGE HARDNESS | D-70 | D-26 | D-37 | D-45 | D-67 | D-61 | D-67 |

Exposing each of the formulations of Examples 2-A through 2-G to a dose of UV irradiation sufficient to effect curing produces a clear deposit having excellent adhesion and exhibiting the hardness value indicated hereinabove in Table Two. The cured bodies were maintained for one day at 140° C. and, except for the product of Example 2-A (which took on a pale yellow color), all were seen to have a high degree of resistance to yellowing; moreover, the quality of each body was seen to be good to excellent.

TABLE THREE

| INGREDIENT | EXAMPLE: 3-A | 3-B |
|---|---|---|
| HEMA | 50.0 | — |
| DMA | — | 50.5 |
| difunctional crosslinking (meth)acrylate | 10.0 | 10.0 |
| PB-204 | 32.0 | 32.0 |
| stabilizers | 1.0 | 1.0 |
| IRGACURE 184 | 2.4 | 2.0 |
| monofunctional acidic acrylate | 2.0 | 2.0 |
| silanes | 1.0 | 1.0 |
| polyamide thickener | 1.6 | 1.5 |
| TOTAL: | 100.00 | 100.00 |

The formulations of Examples 3-A and 3-B were subjected to UV radiation to effect curing, and were found to produce clear, colorless dome-shaped bodies; the optical transmission of the element produced from the formulation of Example 3-A was greater than 95 percent, and that of the element produced from formulation 3-B was greater than 97 percent. Upon heating at 140° C. for three days the dome of Example 3-A took on a pale yellow coloration, whereas that of Example 3-B was light yellow. Although brittle, the cured deposits showed good adhesion.

TABLE FOUR

| INGREDIENT | EXAMPLE: 4-A | 4-B | 4-C | 4-D |
|---|---|---|---|---|
| DMA | 51.5 | 51.6 | 51.3 | 47.5 |
| PB-204 | 34.9 | 34.9 | 34.0 | 32.0 |
| HEMA | 5.0 | — | — | — |
| acrylic acid | — | 9.8 | — | — |
| difunctional crosslinking (meth)acrylate | — | — | 11.0 | 17.0 |
| urethane acrylate resin | 0.7 | 0.7 | 0.7 | 0.7 |
| stabilizers | 2.2 | 2.2 | 2.2 | 2.0 |
| IRGACURE 184 | 0.8 | 0.8 | 0.8 | 0.8 |
| TOTAL: | 100.0 | 100.0 | 100.0 | 100.0 |

To each of the formulations described in Table Four was added about 1.2 to 2.0 weight percent of a polyamide or castor oil-based thickener to prevent slumping. The compositions were subjected to UV radiation sufficient to effect curing, and in all instances dome-shaped elements having a high degree of optical clarity were produced. In contrast, it was unexpectedly found that fumed inorganic thickeners lead to cloudy or hazy products; untreated and treated fumed silica normally produce very clear products in acrylate-based formulations.

TABLE FIVE

| INGREDIENT | EXAMPLE: 5-A | 5-B | 5-C | 5-D | 5-E | 5-F | 5-G |
|---|---|---|---|---|---|---|---|
| PB-504 | 25.00 | — | — | — | 25.00 | — | — |
| PB-383 | — | 25.00 | — | — | — | 25.00 | — |
| BR-220 | — | — | 25.00 | — | — | | 25.00 |
| BR-101 | — | — | — | 25.00 | — | — | — |
| BR-73 | — | — | — | — | — | — | — |
| DMA | 72.00 | 72.00 | 72.00 | 72.00 | — | — | — |
| THFA | — | — | — | — | 72.00 | 72.00 | 72.00 |
| HEMA | — | — | — | — | — | — | — |
| DAROCUR1173 | 4.00 | 3.00 | 3.00 | 3.00 | 3.00 | 3.00 | 3.00 |
| TOTAL: | 100.0 | 100.0 | 100.0 | 100.0 | 100.0 | 100.0 | 100.0 |

| INGREDIENT | EXAMPLE: 5-H | 5-J | 5-K | 5-L | 5-M | 5-N | 5-O |
|---|---|---|---|---|---|---|---|
| PB-504 | — | 25.00 | — | — | — | — | — |
| PB-383 | — | — | 25.00 | — | — | — | — |
| BR-220 | — | — | — | 25.00 | — | — | — |
| BR-101 | 25.00 | — | — | — | 25.00 | — | — |
| BR-73 | — | — | — | — | — | 25.00 | 25.00 |
| DMA | — | — | — | — | — | 72.00 | — |
| THFA | 72.00 | — | — | — | — | — | 72.00 |
| HEMA | — | 72.00 | 72.00 | 72.00 | 72.00 | — | — |
| DAROCUR1173 | 3.00 | 3.00 | 3.00 | 3.00 | 3.00 | 3.00 | 3.00 |
| TOTAL: | 100.0 | 100.0 | 100.0 | 100.0 | 100.0 | 100.0 | 100.0 |

Curing of the formulations described in Table Five was effected by exposure for 30 seconds to UV radiation rated at 20 mW/cm$^2$, producing solid deposits of generally good quality. The resins employed are, more specifically, described as follows: PB-504 is an acidic acrylic resin, described above; PB-383 is an acidic styrene-acrylic resin; BR-220 is an acrylic resin consisting of methyl methacrylate polymer with n-butyl methacrylate and methacrylic acid; BR-101 is an acrylic resin based on poly(isobutyl methacrylic acid); and BR-73 is a thermoplastic acrylic copolymer.

Comparable results are achieved using the following commercially available resins, which may or may not contain reactive end groups: ELVACITE 4026, an acrylated methylmethacrylate acrylic resin; ELVACITE 4054 and 4059, acrylated acrylic copolymers; ELVACITE 2895, an amine functionalized methyl methacrylate copolymer; ELVACITE 2014, an acrylic resin based on methylacrylate copolymer; ELVACITE 2044, an acrylic resin based on butyl methylacrylate; and DEGALAN P24, an acrylic resin copolymer based on methylmethacylate and butyl methylacrylate. The ELVACITE products are available from Lucite International, Inc., and the DEGALAN product is available from the Degussa-Huls (Rohm America) company.

EXAMPLE SIX

A series of formulations are produced containing 24.5 percent PB-204, 63.7 percent THFA, 5.34 percent TMPTA, 1.96 percent IRACURE 184, 2.5 percent of a combination of stabilizers, and 2.0 percent of one of the acid adhesion promoters specified below. Each formulation was exposed to UV radiation sufficient to effect cure, and the cured material was evaluated for resistance to high-temperature resistance by maintaining the cured body at a temperature of 140° C. for a one-day period.

A formulation containing crotonic acid as the adhesion promoter remained clear; formulations containing acrylic acid and methacrylic acid took on faint yellow casts, and formulations containing acryloyloxyethyl phthalate, trifluoromethacrylate, maleic acid, and itaconic acid took on very pale yellow coloration. In all instances the clarity of the cured body and the level of adhesion to glass were good, with the exception that the trifluoromethacrylate-containing formulation produced only a fair level of adhesion to glass.

curing bears an inverse relationship to the power of the radiation source, from which it is theorized that a mechanism other than, or beyond, free-radical polymerization takes place.

TABLE SIX

| | 1 day | 2 day | 3 day | Cure | Designation |
|---|---|---|---|---|---|
| two-part epoxy | clear | clear | clear/faint yellow | 120° C., 3 hours | STYCAST 1200J |
| two-part urethane | light yellow | amber | dark amber | 60° C., 3 hours | not available |
| aromatic urethane acrylate | amber | dark amber | brown | UV, 20 seconds | 984 |
| aliphatic urethane acrylate | light yellow | yellow | amber | UV, 25 seconds | 9001-E-v3.0 |
| aliphatic UV epoxy | light yellow | amber | dark amber | UV, 30 seconds | 3012 |
| Invention | clear | clear | clear/faint yellow | UV, 5 seconds | Example 2B |

Table Six compares a formulation embodying the invention (Example 2B hereinabove) with standard products, all being of comparable viscosities and all having been maintained at 140° C., for 1–3 days, after curing. The two-part epoxy product is commercially available from Emerson Cummings company under the trade designation STYCAST 1200J, and is especially intended for use in COB-LED encapsulation applications. The two-part urethane listed is of unknown designation and origin, but is also intended for COB-LED encapsulation. The remaining comparative products identified in the Table are commercially available from Dymax Corporation, of Torrington, Conn.

Albeit the STYCAST product exhibited resistance to degradation substantially equal to that of the instant formulation, it will be appreciated that the curing conditions required are relatively extreme, including a cure time that is three orders of magnitude longer; relative ease of manufacture, low energy requirements, high throughput, low rejection rates, and efficient material utilization represent significant advantages in the formulation of the invention. Moreover, the STYCAST product does not appear well suited for forming lenses by direct deposit, and desirable particulate additives, such as semiconducting phosphors, may be difficult to incorporate.

Although the present formulations are particularly suited for the formation of lenses in COB-LED optoelectronic devices, as described, it will be appreciated they are advantageously employed for many other applications as well. For example (and depending of course upon specific composition), they may be utilized as high-temperature, low-outgassing photoinitiated adhesives and coatings, such as for headlamps, flood lamps, heat-sterilized medical devices, optical element assemblies, disc drives, and the like; and as low-energy curing adhesives and coatings for thermally sensitive substrates, such as for high-gloss fingernail coatings, horse-hoof repair adhesives, dome coatings, and the like. It is believed that numerous other applications for these formulations will be apparent to those skilled in the art, based upon the disclosure hereof.

Apart from the intrinsic advantages of the formulations of the invention, it is unexpected that, despite being of non-polymerizing character, the acrylate resins participate in the curing reactions, as they appear to do. It is also surprising that, in some instances, the effectiveness and/or speed of It should perhaps be emphasized that references herein to yellowing or other color development during testing (e.g., at 140° C.) is not necessarily a matter objection to color per se, but rather concern degradation or deterioration. In many instances (if not all), yellowing during heat exposure provides the first sign of degradation in products of this kind, and the deeper or more pronounced the initial discoloration the greater the degradation that has occurred or that will take place over a period of time.

Albeit self-evident to those skilled in the art, it might nevertheless be emphasized that the reactive diluents employed herein are fundamentally distinct from solvents, which do not participate in the polymerization reaction and which have to be removed in the production of any solid body. Products based upon non-polymerizable acrylic resins of the kind described herein have, in the past, invariably (or at least virtually so) comprised an aqueous phase or a substantial amount of solvent for the resin.

Thus, it can be seen that the present invention provides a novel formulation that cures quickly to a transparent solid body of high optical clarity, and that exhibits outstanding resistance to thermal degradation and distortion as well as to degradation from exposure to radiation and moisture. The formulation is especially adapted for the fabrication of bodies suitable for use as transparent protective elements and lenses for COB-LEDs and similar optoelectronic devices, particularly devices that operate at relatively high temperatures, and it is adapted for fabrication by a variety of techniques, including casting and direct deposit upon a substrate in the form of a mechanically unconstrained dome, preceded or followed by irradiation to effect rapid curing of the formulation. The invention also provides novel methods for the production of heat- and radiation-resistance transparent solid bodies and optoelectronic devices comprised of such bodies, and provides solid bodies and optoelectronic devices produced by such methods.

Having thus described the invention, what is claimed is:

1. A non-aqueous, solvent-free formulation, curable by actinic radiation to a clear, heat-resistant solid body, consisting essentially of: about 10 to 40 percent of a nonpolymerizable acrylic resin having substantial inherent acidity; 90 to 45 percent of at least one polymerizable reactive diluent, in which said acrylic resin is substantially completely dissolved, selected from the group of compounds consisting of tetrahydrofuryl (meth)acrylate, N,N-dimethyl acrylamide and carbon and nitrogen-substituted analogs thereof, 2-hydroxyethyl (meth)acrylate, hydroxybutyl (meth)acrylate, hydroxypropyl (meth)acrylate, and alkoxylated counterparts to the aforesaid compounds; an amount of a free-radical photoinitiator sufficient for effecting polymerization of said reactive diluent; zero to about 5 percent of at least one adhesion promoter; zero to about 30 percent of at least one cross-linking agent; zero to about 2 percent of at least one thickener; and zero to about 4 percent of at least one stabilizer, all based upon the weight of said formulation.

2. The formulation of claim 1 wherein said acrylic resin has an inherent acid value of at least about 20 mg KOH/g.

3. The formulation of claim 1 wherein said acrylic resin is produced from an acrylic monomer having a backbone with hydroxyl groups thereon, imparting the inherent acidic character to said resin.

4. The formulation of claim 1 wherein said acrylic resin has a molecular weight less than about 80,000.

5. The formulation of claim 4 wherein said acrylic resin has a molecular weight in the range of about 8,000 to 12,000.

6. The formulation of claim 1 wherein said photoinitiator is a UV-responsive photoinitiator.

7. The formulation of claim 1 containing at least about 1.0 weight percent of an adhesion promoter selected from the group consisting of crotonic acid, acrylic acid and methacrylic acid.

8. A non-aqueous, solvent free formulation, curable by actinic radiation to a clear, heat-resistant solid body, consisting essentially of: about 10 to 40 percent of a nonpolymerizable acrylic resin having an inherent acid value of at least about 20 mg KOH/g and a molecular weight less than about 80,000; 90 to 45 percent of at least one polymerizable reactive diluent, in which said acrylic resin is substantially completely dissolved, selected from the group of compounds consisting of tetrahydrofuryl (meth)acrylate, N,N-dimethyl acrylamide, 2-hydroxyethyl (meth)acrylate, hydroxybutyl (meth)acrylate, and alkoxylated counterparts to the aforesaid compounds; an amount of a free-radical photoinitiator sufficient for effecting polymerization of said reactive diluent; zero to about 5 percent of at least one adhesion promoter; zero to about 30 percent of at least one crosslinking agent; zero to about 2 percent of at least one thickener; and zero to about 4 percent of at least one stabilizer, all based upon the weight of said formulation.

9. The formulation of claim 8 wherein said acrylic resin is produced from an acrylic monomer having a backbone with hydroxyl groups thereon, imparting the inherent acidic character to the said resin.

10. The formulation of claim 8 wherein said reactive diluent is tetrahydrofuryl acrylate.

11. In a method for the production of a clear, transparent, heat-resistant solid body, the steps comprising:

providing a non-aqueous, solvent-free formulation, curable by actinic radiation to a clear, heat-resistant solid body, consisting essentially of: about 10 to 40 percent of a nonpolymerizable acrylic resin having substantial inherent acidity; 90 to 45 percent of at least one polymerizable reactive diluent, in which said acrylic resin is substantially completely dissolved, selected from the group of compounds consisting of tetrahydrofuryl (meth)acrylate, N,N-dimethyl acrylamide and carbon and nitrogen-substituted analogs thereof, 2-hydroxyethyl (meth)acrylate, hydroxybutyl (meth)acrylate, hydroxypropyl (meth)acrylate, and alkoxylated counterparts to the aforesaid compounds; an amount of a free-radical photoinitiator sufficient for effecting polymerization of said reactive diluent; zero to about 5 percent of at least one adhesion promoter; zero to about 30 percent of at least one cross-linking agent; zero to about 2 percent of at least one thickener; and zero to about 4 percent of at least one stabilizer, all based upon the weight of said formulation;

forming a deposit of a quantity of said formulation; and exposing said deposit to actinic radiation for effecting polymerization of said reactive diluent, and thereby to produce said solid body.

12. The method of claim 11 wherein said acrylic resin is produced from an acrylate monomer having a backbone with hydroxyl groups thereon.

13. The method of claim 11 wherein said acrylate resin has an inherent acid value of at least 20 mg KOH/g.

14. The method of claim 11 wherein said resin has a molecular weight less than about 80,000.

15. The method of claim 11 wherein said reactive diluent is tetrahydrofural acrylate, and wherein said molecular weight is in the range 8,000 to 12,000.

16. The method of claim 11 wherein said formulation contains at least about 1.0 weight percent of an adhesion promoter selected from the group consisting of crotonic acid, acrylic acid and methacrylic acid.

17. In a method for the production of an optoelectronic device, the steps comprising:

providing at least one light-emitting element on a substrate;

providing a non-aqueous, solvent-free formulation, curable by actinic radiation to a clear, heat-resistant solid body, consisting essentially of: about 10 to 40 percent of a nonpolymerizable acrylic resin having substantial inherent acidity; 90 to 45 percent of at least one polymerizable reactive diluent, in which said acrylic resin is substantially completely dissolved, selected from the group of compounds consisting of tetrahydrofuryl (meth)acrylate, N,N-dimethyl acrylamide and carbon and nitrogen-substituted analogs thereof, 2-hydroxyethyl (methyl)acrylate hydroxybutyl (meth)acrylate, hydroxypropyl (meth)acrylate, and alkoxylated counterparts to the aforesaid compounds; an amount of a free-radical photoinitiator sufficient for effecting polymerization of said reactive diluent; zero to about 5 percent of at least one adhesion promoter; zero to about 30 percent of at least one cross-linking agent; zero to about 2 percent of at least one thickener; and zero to about 4 percent of at least one stabilizer, all based upon the weight of said formulation;

exposing said deposit to actinic radiation for effecting curing of said deposit, and thereby to produce a solid body; and prior or subsequent to said exposing step, applying said quantity of said formulation to said substrate in overlying relationship to said light-emitting element.

18. The method of claim 17 wherein said resin has an inherent acid value of at least about 20 mg KOH/g, and a molecular weight less than about 80,000.

19. The method of claim 18 wherein said reactive diluent is tetrahydrofural acrylate, and wherein said molecular weight is in the range 8,000 to 12,000.

20. The method of claim 17 wherein said formulation contains at least about 1.0 weight percent of an adhesion promoter selected from the group consisting of crotonic acid, acrylic acid and methacrylic acid.

21. The method of claim 17 wherein said at least one light-emitting element is a light emitting diode.

22. The method of claim 21 wherein said substrate comprises a chip-on-board assembly.

23. The method of claim 22 wherein said quantity of said formulation is cast into a mold to form a shaped deposit, and wherein said shaped deposit is applied to said substrate from said mold subsequent to said exposing step.

24. The method of claim 23 wherein said quantity of said formulation is dispensed directly upon said substrate and prior to said exposing step.

25. The method of claim 24 wherein said quantity of said formulation dispensed is dome shaped.

26. The method of claim 25 wherein said formulation is formulated to have a viscosity value of about 1,000 to 10,000 cP.

27. The method of claim 26 wherein said formulation contains an amount of thixotropic thickener sufficient to impart said viscosity thereto.

28. The method of claim 27 wherein said thickener is a non-silica thixotropic thickener.

29. A clear, transparent, heat-resistant solid body produced by the method of claim 11.

30. An optoelectronic device produced by the method of claim 17.

* * * * *

UNITED STATES PATENT AND TRADEMARK OFFICE

CERTIFICATE OF CORRECTION

PATENT NO. : 7,001,930 B2
APPLICATION NO. : 10/341670
DATED : February 21, 2006
INVENTOR(S) : John R. Arnold and Maria Fe Aton Audia It is certified that error appears in the above-identified patent and that said Letters Patent is hereby corrected as shown below:

In each Claims 15 and 19, column 12, lines 16 and 57, the words "tetrahydrofural" should read "tetrahydrofuryl".

Signed and Sealed this

Twenty-fifth Day of July, 2006

JON W. DUDAS
*Director of the United States Patent and Trademark Office*